United States Patent [19]

Hamel

[11] Patent Number: 5,184,283
[45] Date of Patent: Feb. 2, 1993

[54] POWER DEVICE ASSEMBLY AND METHOD

[75] Inventor: Gregory R. Hamel, Livonia, Mich.

[73] Assignee: Ford Motor Company, Dearborn, Mich.

[21] Appl. No.: 812,412

[22] Filed: Dec. 23, 1991

[51] Int. Cl.$^5$ .............................................. H05K 7/20
[52] U.S. Cl. ..................................... 361/395; 29/840;
 174/16.3; 361/386; 361/388; 361/399; 361/413;
 361/383; 257/712
[58] Field of Search ......................... 29/840; 174/16.3;
 165/80.3, 185; 357/79, 81; 361/380-389, 392,
 394-395, 399, 413; 439/485, 487

[56] References Cited

U.S. PATENT DOCUMENTS

| | | |
|---|---|---|
| 4,118,756 | 10/1978 | Nelson et al. .......................... 361/385 |
| 4,342,068 | 7/1982 | Kling . |
| 4,344,267 | 8/1982 | Corman et al. . |
| 4,720,742 | 1/1988 | Egawa et al. . |
| 4,725,920 | 2/1988 | Ijichi et al. ........................... 361/386 |

Primary Examiner—Gregory D. Thompson
Attorney, Agent, or Firm—Mark L. Mollon; Roger L. May

[57] ABSTRACT

A power device assembly comprises a circuit board sub-assembly and a protective housing enclosing the circuit board sub-assembly. The circuit board sub-assembly includes a heat sink frame around the periphery of a circuit board. Heat generating power devices and, optionally, other circuit devices are mounted in thermally conductive contact with the heat sink frame. Electrical leads extend from the power devices to the circuit board where a solder connection is formed. The heat sink frame extends outwardly beyond the circuit board, at least a portion extending outwardly from the protective housing to provide cooling means for the assembly. According to a method of the invention, a sub-assembly comprising the circuit board, heat sink frame and power device is assembled and the heat sink frame is used as a palette to support and carry the circuit board through a wave soldering process.

14 Claims, 3 Drawing Sheets

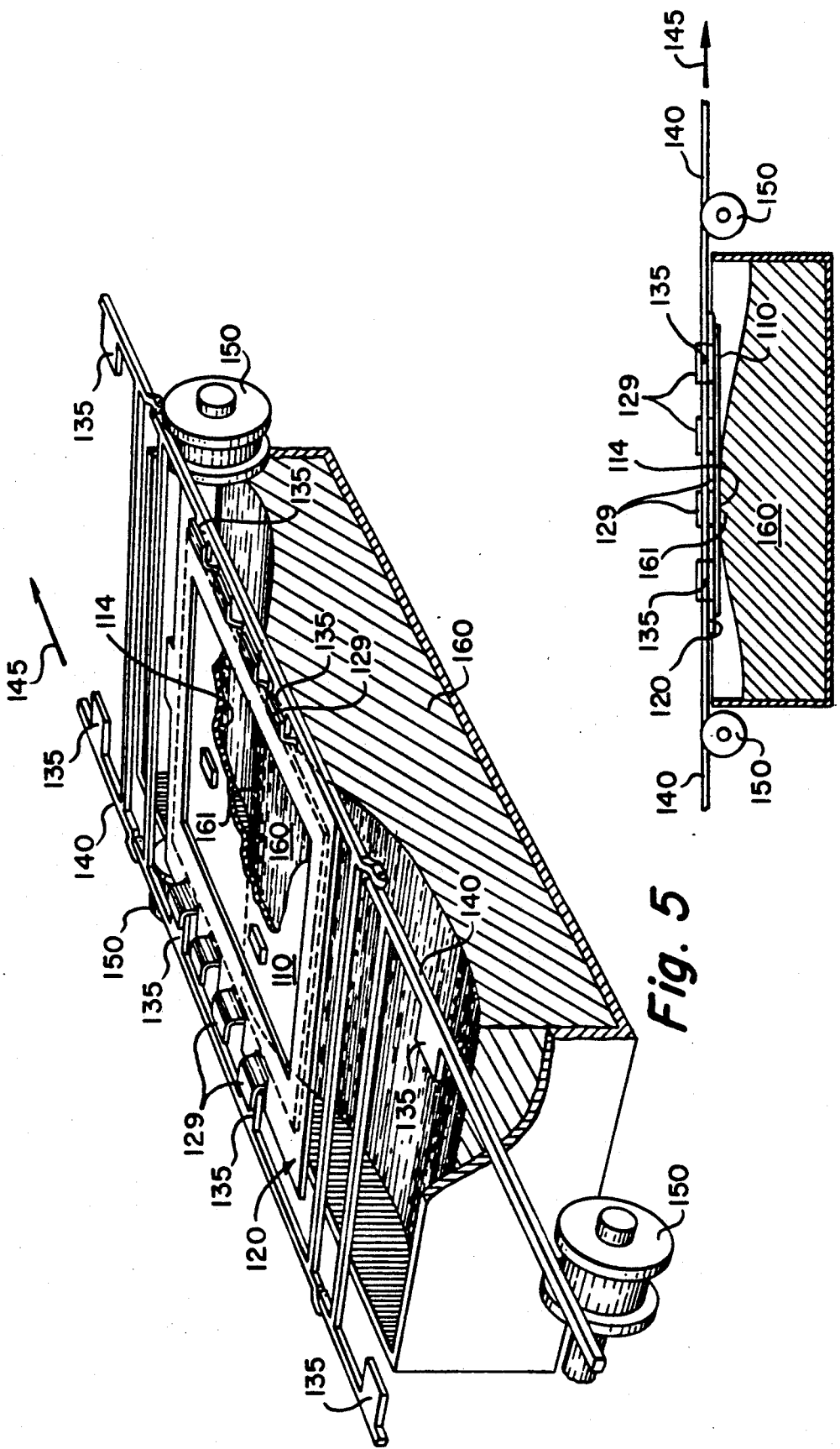

POWER DEVICE ASSEMBLY AND METHOD

FIELD OF THE INVENTION

This invention is directed to a power device assembly and to a method of making such assembly. More particularly, the assembly provides heat dissipation for power devices, such as power amplifiers for car audio systems, and the like.

BACKGROUND OF THE INvENTION

It has long been recognized that mounting IC power devices on circuit boards often requires means for dissipating heat generated by such devices during use. In the past mounting assemblies for individual power devices have been used to hold the device on the circuit board and to enclose the device to prevent tampering and electrical arcing. The teaching of the Kling patent, U.S. Pat. No. 4,342,068 is exemplary. Therein a mounting assembly is taught for an individual power transistor. The power transistor is mounted in thermal contact with a heat dissipating member while a cover encloses, insulates and protects the individual device.

In U.S. Pat. No. 4,345,267 to Corman et al another individual mounting is shown for an integrated circuit device. The device is housed in a connector which mounts it to a printed circuit board or the like. A heat sink or heat exchanger is attached to the housing and is thermally isolated in air except for its connection through the housing to the individual IC device. An individual semi-conductor device carrier, for mounting the device to a socket, is shown in U.S. Pat. No. 4,720,742 to Egawa et al. The Egawa et al patent, however, provides no teaching directed to heat dissipation and is illustrative merely of the practice in the art of individually mounting semi-conductor devices.

Power device assemblies are needed which provide heat dissipation and mounting means for multiple power devices. It is an object of the present invention to provide such assemblies. It is an object of the method aspect of the invention to provide a novel method of making such power device assemblies.

SUMMARY OF THE INVENTION

According to a first aspect of the invention, a power device assembly is provided comprising a circuit board sub-assembly and a protective housing enclosing the circuit board sub-assembly. The circuit board sub-assembly comprises a circuit board mounted to a frame member, more specifically a heat sink frame, which defines an open area exposing at least a major portion of the upper surface of the circuit board. The heat sink frame extends outwardly beyond the periphery of the circuit board. At least one power device, and typically multiple power devices, are mounted in thermally conductive contact with the heat sink frame. Electrically conductive leads from the body of the power device extend to electrical contact with the circuit board. At least a portion of the heat sink frame extends outwardly from the protective housing which encloses the circuit board sub-assembly.

Heat generated by power devices (and optionally other circuitry components) mounted on the heat sink frame is carried out of the protective housing and dissipated by the heat sink frame. The portion of the heat sink frame which extends outwardly of the protective housing acts as a cooling means, a cooling radiator, for the power device assembly. The protective housing can be made openable to facilitate inspection, repair, etc. for the circuit board subassembly. Additional features and advantages of the invention will be readily apparent to those skilled in the art from the detailed discussion below of certain preferred embodiments of the invention.

According to a second aspect of the invention, a method of making a power device assembly is provided. Specifically, a heat sink frame, as described above, is attached to a circuit board. One or more power devices and, optionally, other circuitry devices are assembled on the heat sink frame in thermally conductive contact therewith. Electrical leads from the body of such circuitry devices extend through the circuit board such that the distal ends of the leads are exposed at the lower surface of the circuit board. A soldered assembly is then formed by soldering the leads to the circuit board, specifically, by contacting the distal ends of the leads at the lower surface of the circuit board to a wave of molten solder in a wave soldering process. Significantly, the heat sink frame is employed as a palette for supporting the circuit board during the wave soldering process.

Use of the heat sink frame in the wave soldering step of the invention is a significant advantage. Previously, wave soldering processes for circuit boards typically required that a separate, re-usable palette be fabricated to carry and support the circuit board during the soldering operation. Thus, the circuit board would have to be assembled with the palette before soldering and then disassembled after soldering, the palette then being recycled for use with another circuit board. Depending upon the details of a particular production process, many palettes, perhaps even hundreds, would be required for a production operation. The use of the heat sink frame of the power device assembly of the present invention or the palette for the circuit board in a wave soldering operation is, therefore, a significant advance in the art. Additional features and advantages of the method aspect of the invention will be more apparent from the detail discussion below of certain preferred embodiments.

BRIEF DESCRIPTION OF DRAWINGS

The detailed description of certain preferred embodiments of the invention is provided below with reference to the accompanying drawings wherein the same reference numeral is used for a given feature in all figures.

FIG. 5 is a schematic perspective view, partially broken away, of a wave soldering process in accordance with the method aspect of the present invention.

FIG. 6 is a side elevation view, partially broken away, of the wave soldering process of FIG. 5.

DETAILED DESCRIPTION OF CERTAIN PREFERRED EMBODIMENTS

Figure 1:
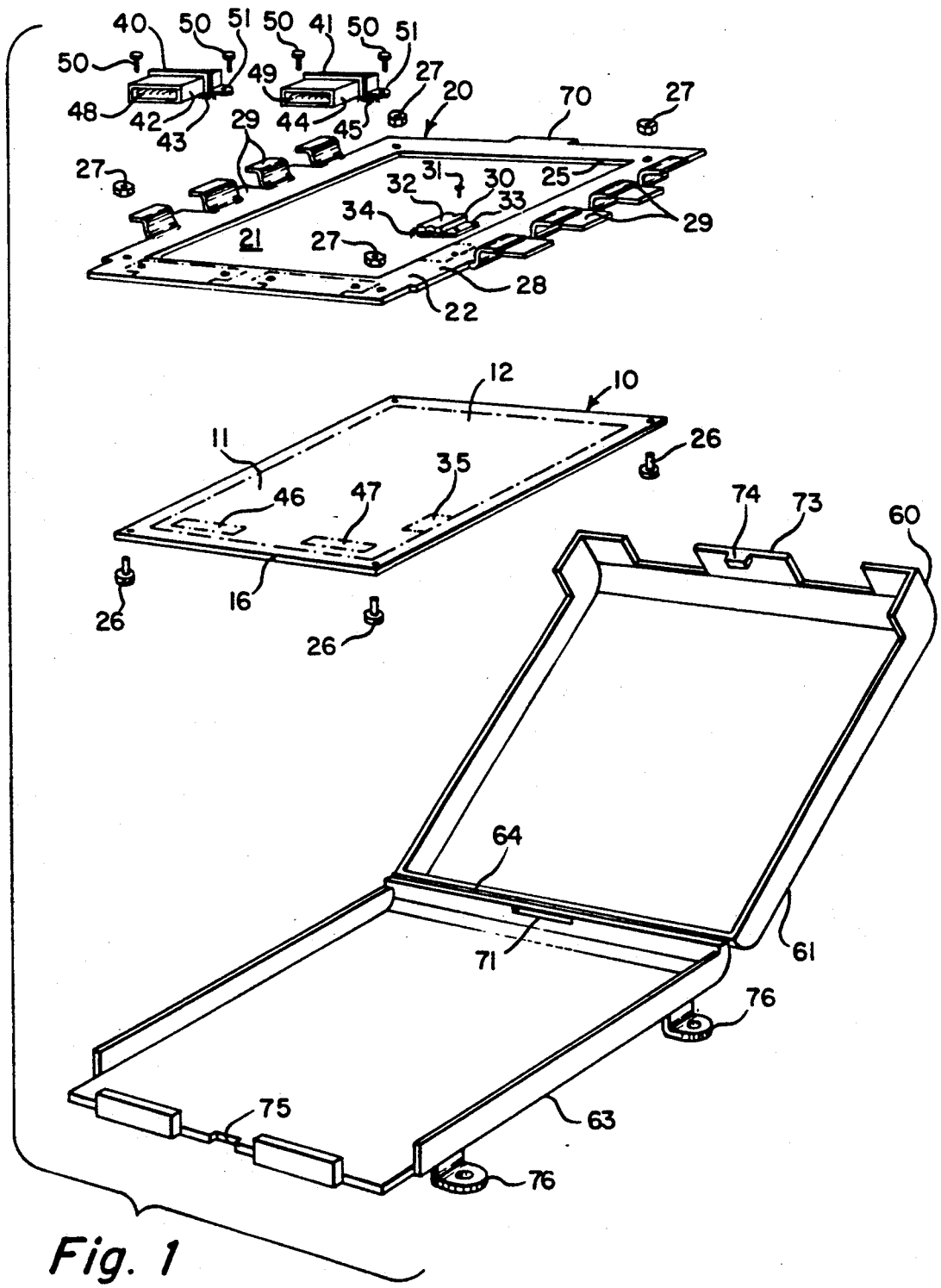
FIG. 1 is an exploded, perspective view of a power device assembly in accordance with a preferred embodiment of the invention.

In the discussion below and in the claims which follow it should be understood that all directional terms including, for example, reference to an upper or lower surface of a component, are used for convenience and correspond generally to the orientation illustrated in the drawings. Such terms are not meant to limit the invention to any particular configuration or use in any particular orientation.

Referring now to FIGS. 1–4, a power device assembly in accordance with one preferred embodiment or version of the invention is seen to comprise a circuit board 10 having an upper surface 12, a lower surface 14 and a peripheral edge 16. The circuit board may be of any suitable construction, of which several are well known to those skilled in the art, being referred to as circuit boards, printed circuit boards, printed wiring boards and the like. Typically, the circuit board will be formed of reinforced epoxy, phenolic such as XXXP phenolic, FR3, FR4, CEM1 and the like, and will have circuitry components mounted on upper surface 12, and in certain embodiments, on both surfaces 12 and 14. Components of the circuit board, including these surface mounted circuitry devices, are deleted from the drawings for clarity and simplicity of illustration.

A highly significant additional component of the power device assembly of the invention is the heat sink frame. In the illustrated embodiment, heat sink frame 20 is seen to have an upper surface 22 and a lower surface 24. Lower surface 28 of inward portion 25 of heat sink frame 20 overlaps and sits on an outer peripheral portion of the upper surface 12 of circuit board 10, that is, a perimeter portion near the peripheral edge 16. The heat sink frame 20 is mounted to the circuit board. Innumerable suitable mounting means will be readily apparent to those skilled in the art including, for example, adhesive, fasteners and the like. In the illustrated embodiment, mounting screws 26 are passed through the four corners of the circuit board 10 from its lower surface 16 into and through the heat sink frame 20 to engage corresponding mounting nuts 27. A heat generating power device 30 mounted in thermally conductive contact on upper surface 22 of heat sink frame 20 has a body 32 and electrically conductive leads 34 which extend from the body 32 to and through the circuit board 10. Thus, circuit board 10 has through holes 35 corresponding to leads 34 from the power device 30. Power device 30 is fastened to the heat sink frame 20 by means of fastener 31 passing through outwardly extending power device flange 33. Distal ends 36 of the leads 34 are exposed at lower surface 14 of the circuit board 10, where a solder connection is formed with the circuit board. In the illustrated embodiment, the heat sink frame 20 forms an unbroken, continuous frame completely about the periphery of the circuit board. It will be readily understood by those skilled in the art in view of the present disclosure that the frame could be discontinuous about the periphery of the circuit board. Also, it could be formed in multiple segments. The open area 21 framed by heat sink frame 20 can be seen to leave major portion 11 of the upper surface 12 of circuit board 10 exposed.

Figure 4:
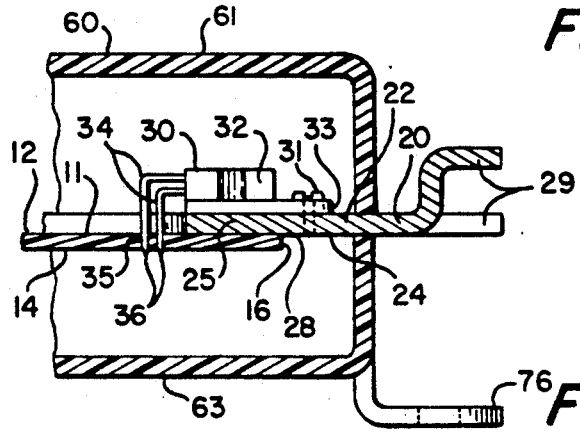
FIG. 4 is an enlarged cross-section view, partially broken away, taken through line 4—4 in FIG. 3.

As noted above, and as best seen in FIG. 4, power device 30 is mounted on heat sink frame 20. More specifically, it is mounted on upper surface 22 of the heat sink frame 20, so as to be in good thermally conductive contact with the heat sink frame. Thus, heat generated by the power device 30 is passed to the heat sink frame. The heat sink frame is formed of a thermally conductive material, preferably metal such as, for example, aluminum or an aluminum alloy, steel, brass or the like. It can be formed in any suitable manner, such as powder metal casting, forging, etc., but for economic reasons is preferably formed by a metal stamping operation in accordance with techniques well known to those skilled in the art. The heat sink frame extends outwardly beyond the circuit board 10. The outwardly extending portion will be referred to as flange portion 28 although, as best seen in FIG. 4, the flange portion 28 of heat sink frame 20 may be simply a continuation in the same plane of the inner portion 25 which overlaps the circuit board 10. At least part of the outer periphery of flange portion 28 is formed into fin segments 29 offset alternately up and down relative each other.

In the illustrated embodiment, the power device assembly further comprises electrical connector means 40 and 41 which are mounted on the upper surface 22 of the heat sink frame 20, similar to the mounting of power device 30. The electrical connector means 40, 41 have body portions 42 and 44, respectively, and electrically conductive leads 43 and 45, respectively. Electrical connector means 40 and 41 are mounted to the upper surface 22 of heat sink frame 20 by means of fasteners 50 passing through tabs 51 extending from the body 42, 44 of the electrical connector means 40, 41, respectively. The leads of the connector means extend downwardly through the circuit board 10 to form solder connections at the lower surface 14 of the circuit board 10, substantially as described above for the power device 30. Thus, circuit board 10 has through holes at 46 and 47 corresponding to leads 43 and 45, respectively.

The electrical connector means 40, 41 are adapted to receive a power lead to energize the power device assembly. Specifically, leaded sockets 48 and 49 each is adapted to receive a plug end of a power lead. In an automotive application of the power device assembly, wherein the power device 30 is an IC audio power amplifier to drive the speakers of a vehicle audio system, the electrical connector means 40 and 41 would be adapted to receive a power lead, for example, from a wiring harness of the vehicle to energize the power device assembly with electrical power from the vehicle's electrical system. In such preferred embodiment, there would be typically multiple power devices 30 mounted on the upper surface 22 of the heat frame 20. Other heat generating power devices would be employed in alternative applications of the invention, many of which will be readily apparent to those skilled in the art in view of the present disclosure. The heat sink frame can act as a heat sink and cooling means for the entire circuit board.

The power device assembly further comprises a protective housing 60 which encloses the circuit board sub-assembly, that is, the circuit board, heat sink frame and circuitry devices discussed above. At least a portion of the flange 28 of the heat sink frame 20 extends outwardly from the protective housing, as now more fully discussed.

Figure 2:
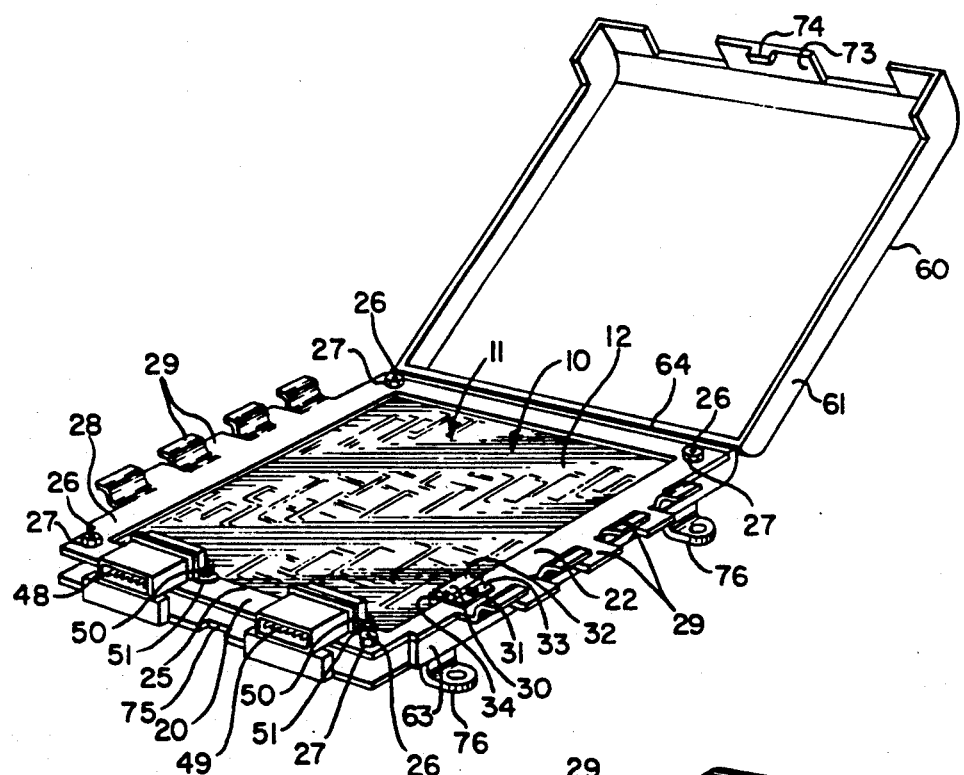
FIG. 2 is a perspective view of the assembled power device assembly of FIG. 1, with the protective housing in an open position.

As best seen in FIG. 1, the protective housing 60 is a plastic clamshell protective housing having two oppositely concave halves 61, 63. The two oppositely concave halves are joined to each other via a living hinge 64, that is, a unitary, flexible web extending between the two halves. Thus, the halves can be opened and closed about the circuit board sub-assembly. As best seen in FIG. 2, the circuit board sub-assembly is received into one of the two concave halves (the lower half in the illustrated embodiment). Preferably the circuit board sub-assembly is releasably engageable or lockable into the housing. In the illustrated embodiment, the heat sink frame 20 comprises a tab 70 which is received in corresponding slot 71 in the housing. Preferably a "snap fit" is formed between the circuit board sub-assembly and the housing.

Figure 3:
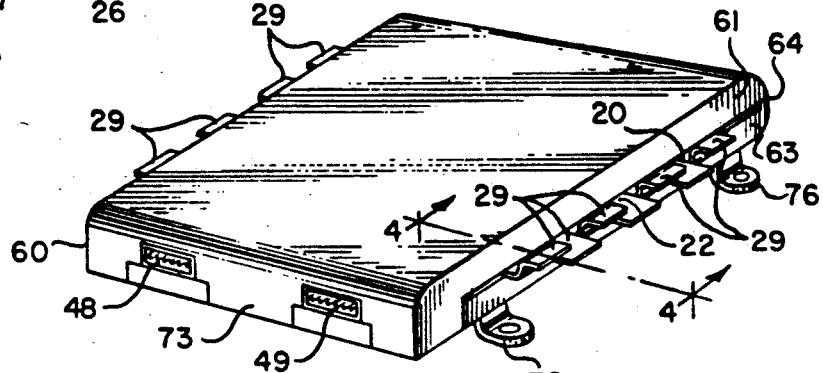
FIG. 3 is a perspective view of the power device assembly of FIGS. 1 and 2, showing the protective housing in the closed position.

It is also preferred that the housing be releasably lockable in its closed position. In the illustrated embodiment, a nub 74 on flange 73 at the front of upper half 61 of the housing 60, with which they are unitary, is adapted to fit into corresponding slot 75 in lower half 63 of the housing. The closed position of the housing is illustrated in FIG. 3. Preferably, the housing further comprises means for mounting the power device assembly to a support structure, for example, a wall or the like in a motor vehicle trunk, which is a preferred location for embodiments of the invention employed for audio power ICs for a vehicle audio system. In the illustrated embodiment, unitary tabs or feet 76 are provided, each having a through hole to receive a screw or other suitable fastener. Innumerable alternative mounting means will be readily apparent to those skilled in the art in view of the present disclosure.

The protective housing can be made by any of innumerable forming methods well known to those skilled in the art. Plastic housings, for example, can be molded of thermoplastic or thermoset plastic, for example, high temperature ABS. The mounting means, fasteners, etc. of the housing can be unitary therewith, preferably being formed during the molding process.

In the closed position, at least some of the flange portion 28 of the heat sink frame 20 extends outwardly from the protective housing 60. As best seen in FIGS. 3 and 4, the fins 29 of the illustrated embodiment are outside the protective housing 60 so as to better remove heat generated by the one or more power devices from the power device assembly. As best seen in FIG. 3, the power lead receiving sockets 48 and 49 of the electrical connector means 40 and 41, respectively, are exposed and thus accessible to a power lead when the protective housing 60 is in the closed position. Notwithstanding the extension of the heat sink frame outwardly from the protective housing and the accessibility of the electrical connector means' sockets, good sealing can be achieved by the protective housing in the closed position, by appropriate choice of materials, design, tolerance, etc., to exclude most or all moisture, grime, etc. during use of the power device assembly.

According to the method aspect of the invention, a power device assembly in accordance with the invention, as described above, is produced. The method of the invention comprises attaching the circuit board to the heat sink frame such that the heat sink frame overlaps and sits on an outer peripheral portion of the upper surface of the circuit board. As described above, the heat sink frame has a flange portion extending outwardly beyond the periphery of the circuit board. Further, it frames a major portion of the upper surface of the surface area of the circuit board, that is, it defines an open area through which the major portion of the upper surface of the circuit board is exposed. At least one power device is assembled onto the upper surface of the heat sink frame. This can be done either before or after the heat sink frame is mounted to the circuit board. The body of the power device is mounted in thermally conductive contact with the upper surface of the heat sink frame and electrical leads extending from the body of the power device extend downwardly through the open area defined by the heat sink frame and through the circuit board, such that distal ends of the electrically conductive leads are exposed at the lower surface of the surface board. Typically, multiple circuit devices will be so mounted on the heat sink frame including, for example, multiple power devices, electrical connector means as described above, etc.

A soldered assembly is then formed by soldering the electrically conductive leads to the circuit board. More specifically, the distal ends of the electrically conductive leads at the lower surface of the circuit board are brought into contact with a wave of molten solder in a wave soldering process. The use of a standing wave of solder in a wave soldering process for forming soldered connections on circuit boards is well known to those skilled in the art and, with the aid of the present disclosure, they will be readily able to apply such soldering techniques in practicing this invention.

Typically, in a wave soldering process, a circuit board is supported and carried by a so-called palette. The palette is essentially a vehicle or jig which holds the circuit board as it travels through the wave soldering operation. In accordance with a significant aspect of the present invention, the heat sink frame mounted to the circuit board can be used as the palette in the wave soldering process step of the invention. That is, the heat sink frame can be used to support and carry the circuit board (along with the power device and any other circuit devices mounted thereon) through the wave soldering operation. In this way, the need for a separate palette can be avoided. Similarly, the assembly of the circuit board into the palette prior to wave soldering and its disassembly thereafter also can be avoided. Thus, at least in accordance with certain preferred embodiments of the method of the invention, cost savings and production efficiencies are obtained over corresponding wave soldering processes not employing the heat sink frame of the invention to carry the circuit board.

The wave soldering method of the present invention is illustrated schematically in FIGS. 5 and 6. A circuit board 110 is attached to a heat sink frame 120 as described generally above. The heat sink frame has flange portions extending outwardly beyond the periphery of the circuit board, including fins 129. The fins which are at the four corners of the heat sink frame 120 rest on corresponding supports 135 which are part of a conveyor 140. The conveyor 140 is moved along in the direction of arrow 145 on rollers 150. At wave soldering station 155 the conveyor passes over a molten solder wave 160. The upper wave crest 161 contacts the lower surface 114 of the circuit board 110.

Typically and preferably, the soldered assembly is then enclosed within a protective housing. As described above, at least a portion of the heat sink frame would extend outwardly from the protective housing to act as cooling means for the power device assembly. Most preferably, the protective housing is a plastic clamshell type having two oppositely concave halves joined to each other via a living hinge along a shared peripheral edge in accordance with the embodiment illustrated in FIGS. 1–4. The soldered assembly is inserted into engagement, preferably releasable engagement, within one of the two concave halves of the clamshell housing.

The housing is then closed, the two halves preferably forming a releasably lockable engagement with each other. Preferably a seal is formed or a sufficiently close fit is achieved to exclude some or all grime, moisture, etc. to which the power device assembly may be exposed during normal usage.

The various preferred versions or embodiments of the invention described in detail above are intended only to be illustrative of the invention. Those skilled in the art will recognize that modifications, additions and substitutions can be made in the various features and elements of the invention without departing from the true scope and spirit of the invention. The following claims are intended to cover the true scope and spirit of the invention.

What is claimed is:

1. A power device assembly comprising
   (a) a circuit board sub-assembly comprising:
      a circuit, board having an upper surface, a lower surface andd a periphery;
      a heat sink frame mounted to the circuit board and defining an open area exposing at least a major portion of the upper surface of the circuit board, the heat sink frame extending outwardly beyond the periphery of the circuit board; and
      at least one power device having a body and electrically conductive leads extending from the body to electrical contact with the circuit board, the body being mounted in thermally conductive contact with the heat sink frame; and
   (b) a protective housing enclosing the circuit board sub-assembly, at least a portion of the heat sink frame extending outwardly from the protective housing.

2. The power device assembly of claim 1 having multiple said power devices mounted on an upper surface of the heat sink frame in thermally conductive contact therewith, the electrically conductive leads from each power device extending downwardly in the open area to the upper surface of the circuit board and through the circuit board to a solder connection at the lower surface of the circuit board.

3. The power device assembly of claim 1 further comprising electrical connector means for receiving a power lead to energize the power device assembly, the electrical connector means comprising a body mounted on the heat sink frame and electrical leads extending in the open area to electrical contact with the circuit board.

4. The power device assembly of claim 1 wherein the heat sink frame is mounted to the upper surface of the circuit board, a portion of a lower surface of the heat sink frame overlapping a peripheral portion of the upper surface of the circuit board, said power device being mounted on the upper surface of the heat sink frame, the electrically conductive leads of the power device extending downwardly in the open area to the upper surface of the circuit board and through the circuit board to a solder connection at the lower surface of the circuit board.

5. The power device assembly of claim 1 wherein at least a portion of the heat sink frame extending outwardly from the protective housing forms offset fin segments.

6. The power device assembly of claim 1 wherein the heat sink frame extends unbroken completely around the periphery of the circuit board.

7. The power device assembly of claim 1 wherein the protective housing comprises a plastic clamshell housing having two oppositely concave halves joined to each other via a living hinge along a shared peripheral edge and releasably lockable to each other in a closed position enclosing the circuit board subassembly.

8. The power device assembly of claim 7 wherein the circuit board sub-assembly forms a snap fit within one of the concave halves of the plastic clamshell housing.

9. The power device assembly of claim 7 further comprising mounting means for mounting the power device assembly to a structure, the mounting means comprising at least one plastic extension unitary with the plastic clamshell housing and adapted to receive a fastener.

10. A power amplifier assembly for powering speakers of a motor vehicle audio system, comprising
   (a) a circuit board sub-assembly comprising:
      a circuit board having an upper surface, a lower surface and a periphery;
      a metal heat sink frame having an upper surface and a lower surface, the heat sink frame being mounted to the upper surface of the circuit board, extending around the periphery of the circuit board and defining an open area exposing a major portion of the upper surface of the circuit board, a portion of the lower surface of the heat sink frame overlapping a peripheral portion of the upper surface of the circuit board, the heat sink frame comprising a flange portion which extends outwardly beyond the peripher,y of the circuit board and forms fin segments offset alternately up and down relative each other;
      a plurality of audio power amplifiers, each having a body mounted on the upper surface of the heat sink frame in thermally conductive contact therewith and electrically conductive leads extending from the body downwardly in the open area defined by the heat sink frame to the upper surface of the circuit board and through the circuit board to solder connections at the lower surface of the circuit board; and
      electrical connector means for receiving a power lead from a source of electrical power to energize the power amplifier assembly, the electrical connector means comprising a connector body mounted on the upper surface of the heat sink frame and connector leads extending downwardly from the connector body in the open area defined by the heat sink frame to the upper surface of the circuit board and through the circuit board to solder connections at the lower surface of the circuit board; and
   (b) a plastic protective clamshell housing enclosing the circuit board sub-assembly, having two oppositely concave halves joined to each other by a living hinge along a shared peripheral edge and comprising fastener means unitary therewith for releasably locking each of the concave halves to the other in a closed position about the circuit board sub-assembly, and mounting means unitary therewith for mounting the power amplifier assembly to a structure, the circuit board subassembly being releasably lockable into one of the concave halves of the protective housing, the fin segments of the flange portion of the heat sink frame extending outwardly beyond the protective housing in its closed position.

11. The power amplifier assembly of claim 10 wherein the heat sink frame has a tab outwardly extending from its periphery, the tab being received in a corresponding slot in the protective housing.

12. A method of making a power device assembly, comprising:

(A) attaching a circuit board having an upper surface, a lower surface and a periphery to a lower surface of a heat sink frame extending around the periphery of the circuit board and defining an open area exposing at least a major portion of the upper surface of the circuit board, the heat sink frame extending outwardly beyond the periphery of the circuit board;

(B) assembling at least one power device having a body and electrically conductive leads on an upper surface of the heat sink frame, the body of the power device being in thermally conductive contact with the heat sink frame and the electrically conductive leads extending downwardly from the body of the power device through the circuit board; and (C) forming a soldered assembly by soldering the electrically conductive leads to the circuit board by contacting distal ends of the electrically conductive leads at the lower surface of the circuit board to a wave of molten solder in a wave soldering process, using the heat sink frame as a palette for supporting the circuit board during the wave soldering process.

13. The method of making a power device assembly according to claim 12 further comprising enclosing the soldered assembly within a protective housing, wherein at least a portion of the heat sink frame extends outwardly from the protective housing.

14. The method of making a power device assembly according to claim 13 wherein:

the protective housing is a plastic clamshell housing having two oppositely concave halves joined to each other by a living hinge along a shared peripheral edge; and enclosing the soldered assembly within the protective housing comprises inserting the soldered assembly into releasable engagement within one of the two concave halves and then closing and releasably locking the concave halves to each other.

* * * * *